United States Patent
Kato et al.

(10) Patent No.: US 11,555,238 B2
(45) Date of Patent: Jan. 17, 2023

(54) PRODUCING METHOD FOR GOLD SPUTTERING TARGET AND PRODUCING METHOD FOR GOLD FILM

(71) Applicant: TANAKA KIKINZOKU KOGYO K. K., Tokyo (JP)

(72) Inventors: Tetsuya Kato, Tomioka (JP); Yohei Mizuno, Tomioka (JP); Chiharu Ishikura, Tomioka (JP)

(73) Assignee: TANAKA KIKINZOKU KOGYO K. K., Tokyo (JP)

( * ) Notice: Subject to any disclaimer, the term of this patent is extended or adjusted under 35 U.S.C. 154(b) by 13 days.

(21) Appl. No.: 16/894,552

(22) Filed: Jun. 5, 2020

(65) Prior Publication Data

US 2020/0299826 A1    Sep. 24, 2020

Related U.S. Application Data

(63) Continuation of application No. PCT/JP2018/044717, filed on Dec. 5, 2018.

(30) Foreign Application Priority Data

Dec. 6, 2017 (JP) .............................. JP2017-234730

(51) Int. Cl.
  *C23C 14/34*    (2006.01)
  *C22F 1/14*    (2006.01)
  *C23C 14/14*    (2006.01)
  *H01J 37/34*    (2006.01)

(52) U.S. Cl.
  CPC ............ *C23C 14/3414* (2013.01); *C22F 1/14* (2013.01); *C23C 14/14* (2013.01); *H01J 37/3426* (2013.01)

(58) Field of Classification Search
  CPC ................................................ C23C 14/3414
  See application file for complete search history.

(56) References Cited

U.S. PATENT DOCUMENTS

| | | | |
|---|---|---|---|
| 2002/0153071 A1 | 10/2002 | Segal et al. | |
| 2016/0343553 A1* | 11/2016 | Maruko | .................. B21J 5/002 |
| 2019/0103257 A1 | 4/2019 | Kato et al. | |

FOREIGN PATENT DOCUMENTS

| | | |
|---|---|---|
| CN | 103726024 A | 4/2014 |
| EP | 3467141 A1 | 4/2019 |
| JP | 2002-146521 A | 5/2002 |
| JP | 2009-512779 A | 3/2009 |
| JP | 2013-204052 A | 10/2013 |
| TW | 201028490 A | 8/2010 |
| WO | WO 2015/111563 A1 | 7/2015 |
| WO | WO 2017/209281 A1 | 12/2017 |

OTHER PUBLICATIONS

EP, Extended Search Report for European Application No. 18885294. 1, dated Mar. 12, 2021.
Standards National Bureau, "Gold" In, Standard X-ray Diffraction Patterns—vol. 1, Dec. 31, 1953, XP55776897, vol. 079175. p. 33.
KR, Notification of Reason for Refiisal for Korean application No. 10-2020-7015761, dated May 26, 2021.
PCT, International Search Report for PCT/JP2018/044717, dated Jan. 15, 2019.
RU, Office Action for Russian application No. 2020122019, dated Sep. 20, 2021.
TW, Office Action for Taiwanese application No. 107143717, Oct. 18, 2021.
CN, Office Action for Chinese application No. 201880078451.3, dated Sep. 22, 2021.
JP, Office Action for Japanese application No. 2019-558247, dated Jul. 29, 2022.

* cited by examiner

*Primary Examiner* — Jophy S. Koshy
*Assistant Examiner* — Joshua S Carpenter
(74) *Attorney, Agent, or Firm* — Orrick, Herrington & Sutcliffe LLP; Joseph A. Calvaruso; K. Patrick Herman

(57) ABSTRACT

A production method for a gold sputtering target includes: producing a gold sputtering target which is made of gold and inevitable impurities and in which an average value of Vickers hardness is 40 or more and 60 or less, an average value of crystal grain size is 15 μm or more and 200 μm or less, and the {110} plane of gold is preferentially oriented to a surface to be sputtered of the gold sputtering target.

8 Claims, No Drawings

PRODUCING METHOD FOR GOLD SPUTTERING TARGET AND PRODUCING METHOD FOR GOLD FILM

CROSS-REFERENCE TO RELATED APPLICATIONS

This application is a continuation of prior International Application No. PCT/JP2018/044717, filed on Dec. 5, 2018 which is based upon and claims the benefit of priority from Japanese Patent Applications No. 2017-234730 filed on Dec. 6, 2017; the entire contents of all of which are incorporated herein by reference.

FIELD

The present invention relates to a producing method for a gold sputtering target and a producing method for a gold film.

BACKGROUND

An Au film formed using a gold (Au) sputtering target has excellent chemical stability and electrical characteristics of Au itself and has thus been used in various fields. For example, a quartz oscillator device uses an Au sputtered film as, e.g., an excitation electrode to be formed on both surfaces of a quartz chip. In such a quartz oscillator device, an oscillation frequency is adjusted by the thickness of the Au film and, thus, there is demanded an Au sputtering target allowing an Au film having a uniform thickness distribution to be formed during sputtering.

A sputtering target typically has a circular or rectangular plate shape, which is used for planar magnetron sputtering. In addition, a cylindrical sputtering target is also known. The cylindrical sputtering target is higher in terms of the usage rate of a target material during sputtering than the plate-shaped sputtering target, so that the use of such a cylindrical sputtering target has begun for ceramics materials and then for metal- and alloy-based targets. Further, the use of the cylindrical sputtering target for noble metal targets such as a silver (Ag) target is being studied (see Patent Documents 1 and 2).

The use of the cylindrical target, as well as the plate-shaped sputtering target, is being studied also for the Au sputtering target for Au film formation. However, it is difficult for conventional Au sputtering targets to achieve high film thickness distribution uniformity required for the Au film used as an electrode of, for example, a quartz oscillator device, irrespective of whether they are of a plate-shaped or cylindrical type. In particular, the cylindrical Au sputtering target has a great difficulty in improving the Au film thickness distribution uniformity in terms of processing accuracy for the cylindrical shape.

The following describes in more detail the quartz oscillator devices. The quartz oscillator devices are used for mobile devices, for example, and are required to be small in size, lightweight, and thin in association with a demand for reduction in size, weight, and thickness of the mobile devices. For example, the package size of the quartz oscillator device has been reduced from 5.0 mm×3.2 mm (5032 size) to 3.2 mm×2.5 mm (3225 size), 2.5 mm×2.0 mm (2520 size), 2.0 mm×1.6 mm (2016 size), and 1.6 mm×1.2 mm (1612 size) and, correspondingly, a quartz oscillator (quartz chip) itself is being miniaturized.

The quartz oscillator device has the Au film on both surfaces of a quartz chip (blank) as an electrode, as described above. The quartz chip has an outer shape with rounded corners which can be obtained by etching or by mechanical treatment after press punching, so as to bring the center of gravity close to the center for frequency stabilization. When the quartz chip has a rough surface, the frequency characteristics thereof is deteriorated, so that the quartz chip is required to have a surface with high smoothness. Similarly, an electrode to be formed in the quartz chip is required to have high smoothness, i.e., to be small in film thickness variation. The electrode has a three-dimensional structure having a given thickness, so that, in a miniaturized quartz chip, the film thickness variation has a greater influence on the three-dimensional structure. Thus, in order to respond to the miniaturization of the quartz oscillator device and the like, the film thickness variation of the Au film used as the electrode is required to be smaller.

In a 32 kHz quartz oscillator for a timepiece, a variation in the mass of the Au film has a great influence on the frequency characteristics. The 32 kHz quartz oscillator includes a fork type and a tuning fork type in terms of shape. The tuning fork type quartz oscillator is suitable for miniaturization; however, the mass variation of the Au film affects the frequency characteristics, so that a reduction in the mass variation derived from the Au film thickness variation is strongly required. The tuning fork type quartz oscillator has a difficulty in frequency adjustment, and thus various modifications have been made to cope with the drawback. For example, as for the formation method of the Au film, sputtering is now replacing vapor deposition. Further, a part of the Au film formed by sputtering is removed by laser beam for mass adjustment, or a weight for mass adjustment is formed during formation of the Au film by sputtering. In such a situation, when the mass variation derived from the Au film thickness variation can be reduced, the time and trouble required for frequency adjustment can be significantly reduced. In particular, the influence of the film thickness variation becomes greater as the quartz oscillator is reduced in size, with the result that the mass is more likely to vary. Also in this respect, the film thickness variation of the Au sputtered film is required to be reduced.

SUMMARY

The object of the present invention is to provide a gold sputtering target production method allowing improvement in uniformity of the film thickness distribution of a gold film and a gold film production method capable of improving uniformity in film thickness distribution.

A production method for a gold sputtering target according to the present invention includes: producing a gold sputtering target which is made of gold and inevitable impurities and in which an average value of Vickers hardness is 40 or more and 60 or less, an average value of crystal grain size is 15 μm or more and 200 μm or less, and the {110} plane of gold is preferentially oriented to a surface to be sputtered of the gold sputtering target.

A production method for a gold film according to the present invention includes: preparing a gold sputtering target which is made of gold and inevitable impurities and in which an average value of Vickers hardness is 40 or more and 60 or less, an average value of crystal grain size is 15 μm or more and 200 μm or less, and a {110} plane of gold is preferentially oriented to a surface to be sputtered of the gold sputtering target; and forming a gold film on a film-forming base material through sputtering of the gold sputtering target.

EFFECT

According to the gold sputtering target production method of the present invention, it is possible to produce with good reproducibility a gold sputtering target allowing a gold film excellent in uniformity of a film thickness distribution to be obtained. This can improve uniformity of the film thickness distribution of the gold film with good reproducibility. Further, according to the gold film production method of the invention, it is possible to provide a gold film excellent in uniformity of the film thickness distribution with good reproducibility.

DETAILED DESCRIPTION

Hereinafter, an embodiment for practicing the present invention will be described. A sputtering target produced by a production method according to the embodiment is made of gold (Au) and inevitable impurities. The inevitable impurities (elements other than Au) contained in the Au sputtering target are not limited to particular elements. The purity of Au in the sputtering target is determined according to the application of the target or application of a film formed using the target and is set to, for example, 99.99% or more. The use of the sputtering target having an Au purity of 99.99% allows a high-purity Au film to be obtained. Further, the upper limit of the Au purity in the sputtering target is not limited to a particular value and is typically less than 99.999% considering, for example, the production process and production cost of the Au sputtering target and hardness of the Au sputtering target and practically preferably 99.990% or more and 99.998% or less.

The shape of the Au sputtering target according to the embodiment is not limited to a particular shape and may be a plate shape or a cylindrical shape. The plate-shaped sputtering target typically includes, for example, a polygonal (e.g., circular or rectangular) plate-shaped sputtering target. Such a polygonal plate-shaped sputtering target may have any structure; for example, it may have a hollow portion formed by removing a part of the circular plate or polygonal plate or may have a slope, a convex portion, or a concave portion in a part of the surface of the circular plate or polygonal plate. Similarly, the cylindrical sputtering target is not limited to a particular dimension, and the dimension thereof is selected according to a sputtering apparatus. A typical cylindrical sputtering target has an outer diameter of 50 mm or more and 170 mm or less, an inner diameter of 20 mm or more and 140 mm or less, and a length of 100 mm or more and 3000 mm or less, for example Such an Au sputtering target has a surface to be sputtered (sputtering surface). The plate surface serves as the sputtering surface in the plate-shaped sputtering target, and the surface of the cylinder (cylindrical surface) serves as the sputtering surface in the cylindrical sputtering target.

The Au sputtering target according to the embodiment preferably has a Vickers hardness of 40 or more and 60 or less. When an Au splluttering target having the above Vickers hardness is used to perform sputtering, an Au film excellent in uniformity of a thickness distribution can be formed. That is, the fact that the Vickers hardness of the Au sputtering target is more than 60 HV means that strain generated during production remains in the Au sputtering target. In such a case, particles ejected from the target fly non-uniformly during sputtering, deteriorating uniformity of the film thickness distribution. The Vickers hardness of the Au sputtering target is more preferably 55 HV or less. Further, application of heat during sputtering changes hardness or crystal grain size, which also deteriorates uniformity of the particle flying property. On the other hand, when the Vickers hardness of the Au sputtering target is less than 40 HV, crystal orientation may collapse in association with occurrence of crystal grain growth, which deteriorates uniformity of the film thickness distribution. The Vickers hardness of the Au sputtering target is preferably 45 HV or more.

The Vickers hardness of the Au sputtering target is measured as follows. In the case of the plate-shaped sputtering target, the following nine measurement points are set: three points set at 10 mm intervals on a straight line in a surface to be sputtered (sputtering surface), three points selected respectively from three segmented areas obtained by dividing, into three, a first cross section perpendicular to the sputtering surface in the thickness direction (in the following Examples, three points set at 1.5 mm intervals on a straight line extending in the thickness direction of a sample having a 5 mm thickness), and three points selected respectively from three areas obtained by dividing, into three, a second cross section perpendicular to the sputtering surface and the first cross section in the thickness direction (in the following Examples, three points set at 1.5 mm intervals on a straight line extending in the thickness direction of a sample having a 5 mm thickness). Then, the Vickers hardness is measured at the above nine measurement points with a 200 gf test force (pressing load). An average value ($HV_{av1}$) of the Vickers hardness in the sputtering surface, an average value ($HV_{av2}$) of the Vickers hardness in the first cross section, and an average value ($HV_{av3}$) of the Vickers hardness in the second cross section are determined. The average values ($HV_{av1}$/$HV_{av2}$, and $HV_{av3}$) in the sputtering surface, first cross section, and second cross section are further averaged, and the obtained average value is defined as an average value ($HV_{tav}$) of the Vickers hardness of the entire plate-shaped Au sputtering target.

In the plate-shaped Au sputtering target, the ratio ($HV_{av1}$/$HV_{tav}$) of the average value ($HV_{av1}$) of the Vickers hardness in the sputtering surface to the Vickers hardness ($HV_{tav}$) of the entire target, the ratio ($HV_{av2}$/$HV_{tav}$) of the average value ($HV_{av2}$) of the Vickers hardness in the first cross section to the Vickers hardness ($HV_{tav}$) of the entire target, and the ratio ($HV_{av3}$/$HV_{tav}$) of the average value ($HV_{av3}$) of the Vickers hardness in the second cross section to the Vickers hardness ($HV_{tav}$) of the entire target each preferably fall within the range of 0.8 to 1.2. That is, a variation in the Vickers hardness of the Au sputtering target is preferably within ±20%. By thus reducing the location-dependent variation in the Vickers hardness of the Au sputtering target, the flying direction of particles during sputtering is made uniform, which improves the uniformity of the film thickness distribution.

In the case of the cylindrical Au sputtering target, the following nine measurement points are set: three points set at 10 mm intervals on a first straight line extending parallel to the cylindrical axis in the sputtering surface (cylindrical surface), three points set at 10 mm intervals on a second straight line obtained by rotating the first straight line by 90°, and three points selected respectively from three areas obtained by dividing, into three, a cross section perpendicular to the cylindrical axis in the thickness direction (in the following Examples, three points set at 1.5 mm intervals on a straight line extending in the thickness direction of a sample having a 5 mm thickness). Then, the Vickers hardness is measured at the above nine measurement points with a 200 gf test force (pressing load). An average value ($HV_{av1}$) of the Vickers hardness on the first straight line in the sputtering surface, an average value ($HV_{av2}$) of the Vickers hardness on the second straight line, and an average value ($HV_{av3}$) of the Vickers hardness in the cross section are determined. The average values ($HV_{av1}$, $HV_{av2}$, and $HV_{av3}$) of the sputtering surface and cross section are further averaged, and the obtained average value is defined as an average value ($HV_{tav}$) of the Vickers hardness of the entire cylindrical Au sputtering target.

In the cylindrical Au sputtering target, the ratio ($HV_{av1}/HV_{tav}$) of the average value ($HV_{av1}$) of a first Vickers hardness in the sputtering surface to the Vickers hardness ($HV_{tav}$) of the entire target, the ratio ($HV_{av2}/HV_{tav}$) of the average value ($HV_{av2}$) of a second Vickers hardness in the sputtering surface to the Vickers hardness ($HV_{tav}$) of the entire target, and the ratio ($HV_{av3}/HV_{tav}$) of the average value ($HV_{av3}$) of the Vickers hardness in the cross section to the Vickers hardness ($HV_{tav}$) of the entire target each preferably fall within the range of 0.8 to 1.2. That is, a variation in the Vickers hardness of the Au sputtering target is preferably within ±20%. By reducing the location-dependent variation in the Vickers hardness of the cylindrical Au sputtering target, the flying direction of particles during sputtering is made uniform, which improves the uniformity of the film thickness distribution. The cylindrical Au sputtering target is rotated during sputtering, whereby the entire cylindrical surface is sputtered, so that the reduction in the location-dependent variation in the Vickers hardness of the sputtering surface (cylindrical surface) can improve the uniformity of the film thickness distribution.

The Au sputtering target according to the embodiment preferably has an average crystal grain size of 15 μm or more and 200 μm or less. By performing sputtering using the Au sputtering target having such an average crystal grain size, the film thickness distribution of the Au film can be further improved. When the average crystal grain size of the Au sputtering target is less than 15 μm, particles ejected from the target fly non-uniformly during sputtering, which may deteriorate uniformity of the film thickness distribution. The average crystal grain size of the Au sputtering target is more preferably 30 μm or more. When the average crystal grain size of the Au sputtering target exceeds 200 μm, flying property of particles during sputtering lowers, which may deteriorate uniformity of the film thickness distribution. The average crystal grain size of the Au sputtering target is more preferably 150 μm or less.

The average crystal grain size of the Au sputtering target is measured as follows. In the case of the plate-shaped Au sputtering target, the following nine measurement points are set: three points set at 10 mm intervals on a straight line in the sputtering surface, three points selected respectively from three areas obtained by dividing, into three, a first cross section perpendicular to the sputtering surface in the thickness direction (in the following Examples, three points set at 1.5 mm intervals on a straight line extending in the thickness direction of a sample having a 5 mm thickness), and three points selected respectively from three areas obtained by dividing, into three, a second cross section perpendicular to the sputtering surface and the first cross section in the thickness direction (in the following Examples, three points set at 1.5 mm intervals on a straight line extending in the thickness direction of a sample having a 5 mm thickness). Then, an enlarged picture of each measurement point is taken using an optical microscope. The picture is taken at a magnification (e.g., ×50 or ×100) enabling easy measurement of the crystal grain size. Straight lines are drawn horizontally and vertically so as to pass the center of the enlarged picture, and the number of crystal grains cut by each line is counted. The crystal grain at the end of the line is counted as 0.5. The lengths of the respective horizontal and vertical lines are divided by their corresponding number of crystal grains to determine the average grain size for the horizontal line and that for the vertical line. Then, the average value of the determined average grain size values for the horizontal and vertical lines is defined as the average grain size of one sample.

In this manner, an average value ($AD_{av1}$) of the crystal grain size in the sputtering surface, an average value ($AD_{av2}$) of the crystal grain size in the first cross section, and an average value ($AD_{av3}$) of the crystal grain size in the second cross section are determined. The average values ($AD_{av1}$, $AD_{av2}$, and $AD_{av3}$) of the crystal grain size in the sputtering surface, first cross section, and second cross section are further averaged, and the obtained average value is defined as an average value ($AD_{tav}$) of the crystal grain size (the average crystal grain size) of the entire plate-shaped Au sputtering target.

In the plate-shaped Au sputtering target, the ratio ($AD_{av1}/AD_{tav}$) of the average crystal grain size ($AD_{av1}$) in the sputtering surface to the average crystal grain size ($AD_{tav}$) of the entire target, the ratio ($AD_{av2}/AD_{tav}$) of the average crystal grain size ($AD_{av2}$) in the first cross section to the average crystal grain size ($AD_{tav}$) of the entire target, and the ratio ($AD_{av3}/AD_{tav}$) of the average crystal grain size ($AD_{av3}$) in the second cross section to the average crystal grain size ($AD_{tav}$) of the entire target each preferably fall within the range of 0.8 to 1.2. That is, a variation in the average crystal grain size of the Au sputtering target is preferably within ±20%. By thus reducing the location-dependent variation in the average crystal grain size of the Au sputtering target, the flying direction of particles during sputtering is made uniform, which improves the uniformity of the film thickness distribution.

In the case of the cylindrical Au sputtering target, the following nine measurement points are set: three points set at 10 mm intervals on a first straight line extending parallel to the cylindrical axis in the sputtering surface (cylindrical surface), three points set at 10 mm intervals on a second straight line obtained by rotating the first straight line by 90°, and three points selected respectively from three areas obtained by dividing, into three, a cross section perpendicular to the cylindrical axis in the thickness direction (in the following Examples, three points set at 1.5 mm intervals on a straight line extending in the thickness direction of a sample having a 5 mm thickness). An average value ($AD_{av1}$) of the crystal grain size on the first straight line in the sputtering surface, an average value ($AD_{av2}$) of the crystal grain size on the second straight line, and an average value ($AD_{av3}$) of the crystal grain size in the cross section are determined. The average values ($AD_{av1}$, $AD_{av2}$, and $AD_{av3}$) of the sputtering surface and cross section are further averaged, and the obtained average value is defined as an average value ($AD_{tav}$) of the crystal grain size of the entire cylindrical Au sputtering target.

In the cylindrical Au sputtering target, the ratio ($AD_{av1}/AD_{tav}$) of the first average crystal grain size ($AD_{av1}$) in the sputtering surface to the average crystal grain size ($AD_{tav}$) of the entire target, the ratio ($AD_{av2}/AD_{tav}$) of the second average crystal grain size ($AD_{av2}$) in the sputtering surface to the average crystal grain size ($AD_{tav}$) of the entire target, and the ratio ($AD_{av3}/AD_{tav}$) of the average crystal grain size ($AD_{av3}$) in the cross section to the average crystal grain size ($AD_{tav}$) of the entire target each preferably fall within the range of 0.8 to 1.2. That is, a variation in the average crystal grain size of the Au sputtering target is preferably within ±20%. By thus reducing the location-dependent variation in the average crystal grain size of the cylindrical Au sputtering target, the flying direction of particles during sputtering is made uniform, which improves the uniformity of the film thickness distribution. The cylindrical Au sputtering target is rotated during sputtering, whereby the entire cylindrical surface is sputtered, so that the reduction in the location-dependent variation in the average crystal grain size of the sputtering surface (cylindrical surface) can improve the uniformity of the film thickness distribution.

In the Au sputtering target according to the embodiment, the {110} plane of Au is preferably preferentially oriented to the sputtering surface. Au has a face-centered cubic lattice structure, and the {110} plane is more easily sputtered than other crystal planes constituting the face-centered cubic lattice structure. By preferentially orienting the sputtering surface to the {110} plane, the flying direction of particles during sputtering is stabilized, whereby uniformity of the film thickness distribution can be further improved. The preferential orientation of the sputtering surface to the {110} plane refers to a state where the orientation index N of the {110} plane is larger than 1 and the largest among the orientation indices N of all the crystal planes, where the orientation index N of each crystal plane is calculated according to the following Wilson's equation (1) based on a diffraction intensity ratio of each crystal plane of Au, which is obtained by X-ray diffraction for the sputtering surface of the Au sputtering target. The orientation index of the {110} plane of Au is preferably 1.3 or more.

$$N = \left( \frac{\frac{I/I_{(hkl)}}{\Sigma(I/I_{(hkl)})}}{\frac{JCPDS \cdot I/I_{(hkl)}}{\Sigma(JCPD \cdot I/I_{(hkl)})}} \right) \quad (1)$$

In the above equation (1), $I/I_{(hkl)}$ is the diffraction intensity ratio of an (hkl) plane in the X-ray diffraction, $JCPDS \cdot I/I_{(hkl)}$ is the diffraction intensity ratio of the (hkl) plane in JCPDS (Joint Committee for Powder Diffraction Standard) card, $\Sigma(I/I_{(hkl)})$ is the sum of the diffraction intensity ratios of all the crystal planes in the X-ray diffraction, and $\Sigma(JCPDS \cdot I/I_{(hkl)})$ is the sum of the diffraction intensity ratios of all the crystal planes in JCPDS card.

The Au sputtering target according to the embodiment can significantly improve uniformity of the film thickness distribution of the Au sputtered film owing to a combination of the above-described Vickers hardness of 40 or more and 60 or less, average crystal grain size of 15 μm or more and 200 μm or less, and the sputtering surface to which the {110} plane of Au is preferentially oriented. That is, the individual effects brought about by the above-described Vickers hardness, average crystal grain size, and preferentially oriented surface of Au act synergistically, whereby flying property of particles during sputtering, uniformity of the flying property, and stability of the flying direction of the particles are improved. Thus, when the Au sputtered film is used as, for example, an electrode of an electronic device like a quartz oscillator device for which miniaturization is being promoted, it is possible to provide an Au film featured in that a variation in film thickness and a variation in mass resulting from the film thickness variation are reduced and that uniformity of the film thickness and mass distributions is improved.

A method of producing the above-described Au sputtering target according to the embodiment has a step of producing a gold sputtering target which is made of gold and inevitable impurities, and in which the average value of the Vickers hardness is 40 or more and 60 or less, the average crystal grain size is 15 μm or more and 200 μm or less, and the {110} plane of gold is preferentially oriented to the sputtering surface. The Au sputtering target production method preferably includes; a step of preparing a gold ingot having a gold purity of 99.99% or more; a first processing step of processing the gold ingot to form a desired plate-shaped or cylindrical gold billet; a second processing step of processing the gold billet under pressure so as to reduce the plate thickness thereof to form a desired plate-shaped or cylindrical target material; and a heat treatment step of applying heat treatment to the target material.

The Au sputtering target production method according to the embodiment will be described in detail. For example, the plate-shaped Au sputtering target may be produced by a production method combining casting, cutting, forging, and heat treatment of an Au raw material. Further, in the production of the plate-shaped Au sputtering target, rolling may be applied in place of forging of an Au raw material. The cylindrical Au sputtering target may be produced by a production method combining casting, cutting, pipe machining, and heat treatment of an Au material. Examples of the pipe machining include extrusion like Raflo extrusion, drawing, and forging. By controlling a processing rate or a heat treatment temperature in each of the processing steps, the above-described Vickers hardness, average crystal grain size, preferential crystal plane, and the like can be achieved.

The casting of the Au raw material is preferably carried out as follows. The Au raw material is melted in a graphite crucible or a ceramic crucible in a vacuum atmosphere or an inert gas atmosphere; alternatively, the Au raw material is melted in a graphite crucible or a ceramic crucible while spraying inert gas to a molten metal surface using an atmospheric melting furnace or while covering a molten metal surface with a carbon-based solid sealing material. Then, the resultant raw material is cast into a graphite mold or a cast iron mold. Then, defects on the outer peripheral surface of the casted Au ingot are ground to be removed. The purity of the Au ingot is preferably 99.99% or more (4N or more). The upper limit of the Au purity of the Au ingot is not limited to a particular value and is set in accordance with a degree of purity required for an Au sputtered film to be formed. Preferably, the upper limit is set to less than 99.999% considering a production process of the Au sputtering target or hardness thereof.

Subsequently, the obtained Au ingot is processed into a gold billet having a desired plate shape or cylindrical shape (first processing step). When the plate-shaped Au sputtering target is to be produced, defects on the outer peripheral surface of, for example, a plate-shaped Au ingot are ground to be removed, whereby a plate-shaped gold billet is obtained. When the cylindrical Au sputtering target is to be produced, defects on the outer peripheral surface of, for example, a cylindrical shaped Au ingot are ground to be removed and is then hollowed out, whereby a cylindrical shaped gold billet is obtained.

Subsequently, the gold billet is processed into a desired plate-shaped or cylindrical target material (second processing step). When the plate-shaped Au sputtering target is to be produced, a plate-shaped Au ingot is forged into a desired plate shape. The Au ingot forging is preferably performed in a hot state at a temperature in the range of 200° C. or more and 800° C. or less and at a processing rate (sectional area reduction or thickness reduction) of 50% or more and 90% or less. The forging may be performed plurality of times, and heat treatment may be applied during the forging. When the forging is performed plurality of times, the total processing rate is adjusted to 50% or more and 90% or less.

By setting the processing rate in the forging to 50% or more, a cast structure is destroyed, and thus a uniform recrystallized structure is easily obtained. In addition, controllability and uniformity of the hardness or crystal grain size in the subsequent heat treatment process can be enhanced. The obtained Au forged material may be subjected to cold rolling as needed. The processing rate in the rolling is preferably 50% or more and 90% or less, although it depends on the processing rate in the forging process. In place of the forging process, the rolling process may be applied as the Au ingot processing. As in the forging, the Au ingot rolling is preferably performed in a hot state at a temperature in the range of 200° C. or more and 800° C. or less and at a processing rate (sectional area reduction or thickness reduction) of 50% or more and 90% or less.

When the cylindrical Au sputtering target is to be produced, a columnar Au billet is processed into a pipe shape by, for example, extrusion like Raflo extrusion, drawing, or forging. When the Raflo extrusion is applied, it is preferably performed in a cold state. Further, in the Raflo extrusion, the outer diameter and thickness of a pipe to be formed are controlled by the shape (inner diameter, etc.) of a die and the shape (outer diameter, etc.) of a mandrel. At this time, an extrusion ratio (billet outer diameter/pipe outer diameter) is preferably adjusted to 1.5 or more and 3.0 or less. When the extrusion ratio is 1.5 or more, a cast structure is destroyed, and thus a uniform recrystallized structure is easily obtained. In addition, controllability and uniformity of the hardness in the subsequent heat treatment process can be enhanced. However, when the extrusion ratio exceeds 3.0, internal strain becomes too large, and cracks, wrinkles, and other defects are more likely to occur.

When drawing is applied, an Au material pipe produced by the extrusion or hollowing is preferably processed into a desired pipe shape through cold drawing. Further, in the drawing, the outer diameter and thickness of a pipe to be formed are controlled by the shape (inner diameter, etc.) of a die and the shape (outer diameter, etc.) of a plug. At this time, a processing rate per drawing process is preferably adjusted to 2% or more and 5% or less. The drawing is preferably performed plurality of times and, in such a case, the total processing rate is preferably adjusted to 50% or more and 90% or less. When the total processing rate is 50% or more, a cast structure is destroyed, and thus a uniform recrystallized structure is easily obtained. In addition, controllability and uniformity of the hardness in the subsequent heat treatment process can be enhanced. However, when the total processing rate exceeds 90%, internal strain becomes too large, and cracks, wrinkles, and other defects are more likely to occur.

When forging is applied, an Au material pipe produced by the extrusion or hollowing is preferably forged in a hot state at a temperature in the range of 200° C. or more and 800° C. or less into a desired pipe shape. Further, by controlling a processing rate during forging, the outer diameter and thickness of a pipe to be formed are controlled. In the forging, the processing rate is preferably adjusted to 30% or more and 80% or less. When the processing rate is 30% or more, a cast structure is destroyed, and thus a uniform recrystallized structure is easily obtained. In addition, controllability and uniformity of the hardness in the subsequent heat treatment process can be enhanced. However, when the processing rate exceeds 80%, internal strain becomes too large, and cracks, wrinkles, and other defects are more likely to occur.

Then, the plate-shaped target material produced through the forging or rolling and the pipe-shaped target material produced through the pipe machining are subjected to heat treatment at a temperature of 200° C. or more and 500° C. or less under an air atmosphere or inert gas atmosphere, for example to recrystallize the metal structure of the target material. Through such heat treatment, an Au sputtering target having a Vickers hardness of 40 or more and 60 or less can be obtained. Further, an Au sputtering target having an average crystal grain size of 15 μm or more and 200 μm or less and/or an Au sputtering target in which the sputtering surface is preferentially oriented to the {110} plane can be obtained. The heat treatment may be performed plurality of times. After the heat treatment, the sputtering target may be shaped as needed by, for example, cutting.

When the heat treatment temperature is less than 200° C., internal strain generated during processing cannot be removed sufficiently, which may increase the Vickers hardness to more than 60. Further, the heat treatment temperature of less than 200° C. fails to sufficiently recrystallize the metal structure of the target material, which may fail to preferentially orient the sputtering surface to the {110} plane. On the other hand, when the heat treatment temperature exceeds 500° C., the Vickers hardness may become less than 40. Further, a recrystallized structure excessively grows, which may cause the average crystal grain size to exceed 200 μm or cause the sputtering surface to be preferentially oriented to a crystal plane other than the {110} plane. The holding time of heat treatment temperature, i.e., heat treatment time is preferably 10 min or more and 120 min or less, for example. An excessively short heat treatment time may fail to achieve sufficient strain removal or sufficient recrystallization of a metal structure. On the other hand, an excessively long heat treatment time may result in an excessive reduction in the Vickers hardness or an excessive increase in the average crystal grain size.

As described above, by controlling the processing rate when processing the Au ingot into the plate shape or cylindrical shape and the temperature in the heat treatment for recrystallization, an Au sputtering target having a Vickers hardness of 40 or more and 60 or less and small in variation in the Vickers hardness can be obtained. Further, an Au sputtering target having an average crystal grain size of 15 μm or more and 200 μm or less and small in variation in the average crystal grain size, and/or an Au sputtering target in which the sputtering surface is preferentially oriented to the {110} plane can be obtained. By forming an Au film using such an Au sputtering target, an Au film achieving a high film thickness distribution uniformity required for an electrode of, for example, a quartz oscillator device can be obtained. The Au sputtering target according to the embodiment can be used for forming not only an electrode film (Au film) of a quartz oscillator device, but also an Au film applied to various electronic components.

The following describes a gold (Au) film production method according to the embodiment. The gold (Au) film production method according to the embodiment includes a step of preparing a gold (Au) sputtering target which is made of gold and inevitable impurities, and in which the average value of the Vickers hardness is 40 or more and 60 or less, the average crystal grain size is 15 μm or more and 200 μm or less, and the {110} plane of gold is preferentially oriented to the sputtering surface and a step of forming an gold (Au) film on a film-forming base material through sputtering of the gold sputtering target. The step of preparing an Au sputtering target includes the steps of producing the Au sputtering target according to the above-described production method, and specific conditions therefor are as described above.

The step of forming the Au film forms the Au film on a film-forming base material through sputtering of the Au sputtering target according to the embodiment. As described in the above Au sputtering target production method, the Au sputtering target may be a plate-shaped target or a cylindrical target. In the present invention, various sputtering methods may be applied, such as a DC sputtering method (diode, triode, or quadode sputtering), an RF sputtering method, a magnetron sputtering method, an ion beam sputtering method, or an ECR (Electron Cyclotron Resonance) sputtering method.

In the step of forming the Au film (i.e., sputtering step), the Au sputtering target according to the embodiment and a film-forming base material are disposed in a vacuum chamber of a sputtering apparatus. The film-forming base material may include a substrate on which the Au sputtering target according to the embodiment and the Au film are deposited, such as a quartz substrate (quartz oscillator), a semiconductor substrate, a glass substrate, or a metal substrate, and a film such as a resin film, a metal film, or a resin-metal composite film. Then, the vacuum chamber is evacuated to a predetermined vacuum level, and a sputtering gas such as an Ar gas or nitrogen gas is introduced into the vacuum chamber. In this state, processing according to a sputtering method to be applied is performed. For example, in the DC sputtering method, RF sputtering method, and magnetron sputtering method, a DC voltage or an RF voltage is applied between the Au sputtering target and the film-forming base material while generating plasma in the vacuum chamber. In the ion beam sputtering method, the Au sputtering target is irradiated with ion beam. Then, sputtered particles (Au particles), which are released from the Au sputtering target by means of ionized sputtering gas molecules or by irradiation of the ion beam, are deposited onto the film-forming base material, to thereby form the Au film.

Sputtering conditions in the Au film formation step, for example, vacuum level, sputtering gas pressure, power to be applied between the sputtering target and the base material, and the distance between target and the base material are not particularly limited and are appropriately set according to, for example, an applied sputtering method, an applied sputtering apparatus, the shape of the Au sputtering target, and the thickness and area of an Au film to be formed. Further, a sputtering apparatus to be used in the Au film formation is also not limited to a particular type and may be of various types, such as a single wafer type, batch type, multi-chamber type, load lock type, and in-line type. The Au sputtering target may be a plate-shaped target or a cylindrical target, as described above, and thus, a sputtering apparatus is selected according to the shape of the Au sputtering target.

The sputtering method and conditions to be used in the Au film formation step are not limited to those described in Examples to be described later. For example, the Au film may be formed under the following conditions. That is, the Au sputtering target and film-forming base material are set in a DC sputtering apparatus. The sputtering apparatus is vacuum-evacuated to an ultimate vacuum of $8 \times 10^{-4}$ Pa or less. After achievement of the above vacuum level, an Ar gas is introduced into the sputtering apparatus, and the film-forming base material is etched for, e.g., 5 min with the vacuum level adjusted to, e.g., about 0.4 Pa or more and about 0.53 Pa or less. Then, after the adjustment of the vacuum level to, e.g., about 0.4 Pa or more and about 0.53 Pa or less, pre-sputtering is performed with applied power of DC 500 W for 5 min After the adjustment of the vacuum level to, e.g., about 0.4 Pa or more and about 0.53 Pa or less, sputtering is performed with applied power of DC 500 W for 5 min, to thereby form an Au film. The formed film is cooled in the sputtering apparatus for one hour.

According to the above-described Au film production method of the embodiment, an Au film excellent in uniformity of a film thickness distribution can be obtained based on the Vickers hardness and average crystal grain size of the Au sputtering target used for the Au film formation and the plane ({110} plane) preferentially oriented to the sputtering surface. Thus, an Au film having high uniformity of a film thickness distribution and having high resistance uniformity achieved based on the high film thickness distribution uniformity can be provided for various devices, such as quartz oscillator devices, semiconductor devices, LED devices, LCD devices, OLED devices, magnetic devices, battery devices, and optical devices, and for various materials such as electronic materials and functional materials. As a result, an increase in production yield, a reduction in size, an increase in performance, etc. of various devices and various functional materials can be achieved.

As described above, it is important to reduce a variation in the film thickness of the Au film during film formation and, in order to achieve this, optimization of Au film formation conditions is critical. According to the film formation method of the embodiment, a variation in the film thickness can be reduced, thus widening selection range of the film formation conditions and simplifying condition setting for film formation, which allows an efficient Au film formation. Further, a small variation in the film thickness of the Au film allows a variation in the mass of the Au film to be reduced in, for example, a quartz oscillator, so that product yield can be improved.

EXAMPLES

The following describes specific Examples of the present invention and evaluation results thereof.

Example 1

First, an Au mass was put into a graphite crucible and melted. An obtained Au molten was cast into a graphite mold to produce a plate-shaped Au ingot. The surface of the Au ingot was ground, whereby an Au billet (purity: 99.99%, analyzed by solid-state emission spectrometry and ICP) having a width of 190 mm, a length of 270 mm, and a thickness of 50 mm was produced. Subsequently, the Au billet was hot-forged at a temperature of 800° C., whereby an Au target material having a width of 70 mm, a length of 200 mm, and a thickness of 45 mm was obtained. The processing rate in the forging was set to 80% for all three-axis directions. The Au target material after forging was subjected to heat treatment at a temperature of 500° C. for 30 minutes. The Au target material after the heat treatment was ground to produce a circular plate-shaped Au sputtering target having a diameter of 152.4 mm and a thickness of 5 mm. For measurement of characteristics of each portion and measurement of film thickness characteristics, two Au sputtering targets were prepared. In this regard, the same applies to the following Examples and Comparative Examples.

The Vickers hardness of the obtained Au sputtering target was measured according to the above-described plate-shaped sputtering target measurement method (apparatus name: mitsutoyo HM123). The Vickers hardness was measured at the above-described measurement points with a 200 gf test force (pressing load). The results were as follows: the average value ($HV_{av1}$) of the Vickers hardness in the sputtering surface was 50.5, the average value ($HV_{av2}$) of the Vickers hardness in the first cross section was 52.1, the average value ($HV_{av3}$) of the Vickers hardness in the second cross section was 51.6, and the average value (Vickers hardness ($HV_{tav}$) of the entire target) of the $HV_{av1}$, $HV_{av2}$, and $HV_{av3}$ was 51.4. The ratios of the $HV_{av1}$, $HV_{av2}$, and $HV_{av3}$ to the Vickers hardness ($HV_{tav}$) of the entire target were 0.98 ($HV_{av1}/HV_{tav}$), 1.01 ($HV_{av2}/HV_{tav}$), and 1.00 ($HV_{av3}/HV_{tav}$), respectively.

Then, the average crystal grain size of the Au sputtering target was measured according to the above-described plate-shaped sputtering target measurement method (apparatus name: OLYMPUS DSX500). As a result, the average crystal grain size ($AD_{tav}$) of the entire target was 34.2 μm. Further, the sputtering surface of the Au sputtering target was subjected to X-ray diffraction, and the preferentially oriented crystal plane was evaluated according to the above-described method. As a result, preferential orientation of the {110} plane of Au to the sputtering surface was recognized. Further, the orientation index N of the {110} plane according to the above-described method was determined, and the result was 1.32. Such an Au sputtering target was subjected to a film formation process to be described later, and the characteristics of an Au film to be obtained were evaluated.

hardness, average crystal grain size, preferentially oriented plane of the sputtering surface, and orientation index N of the {110} plane were measured and evaluated in the same manner as in Example 1. The measurement results are shown in Table 2. Such an Au sputtering target was subjected to a film formation process to be described later, and the characteristics of an Au film to be obtained were evaluated. In the Au sputtering target of Comparative Example 1, a crystal grain boundary failed to be clearly identified, so that the average crystal grain size could not be measured (corresponding field in Table 1 is blank (–)).

TABLE 1

| | Au purity [%] | Processing rate during forging [%] | Heat treatment condition Temperature [° C.] | Time [min] |
|---|---|---|---|---|
| Ex. 1 | 99.99 | 80 | 500 | 30 |
| Ex. 2 | 99.99 | 80 | 500 | 60 |
| Ex. 3 | 99.99 | 80 | 500 | 90 |
| Ex. 4 | 99.99 | 80 | 400 | 30 |
| Ex. 5 | 99.99 | 80 | 300 | 30 |
| Ex. 6 | 99.99 | 80 | 400 | 60 |
| Ex. 7 | 99.99 | 80 | 300 | 60 |
| Comp. Ex. 1 | 99.99 | 80 | 100 | 30 |
| Comp. Ex. 2 | 99.99 | 80 | 600 | 30 |

TABLE I

| | Vickers hardness* | | | | Average crystal grain size [μm] | Preferential crystal plane | {110} plane orientation index N |
|---|---|---|---|---|---|---|---|
| | $HV_{tav}$ | $HV_{av1}$ | $HV_{av2}$ | $HV_{av3}$ | $AD_{tav}$ | | |
| Ex. 1 | 51.4 | 50.5 (0.98) | 52.1 (1.01) | 51.6 (1.00) | 34.2 | {110} | 1.32 |
| Ex. 2 | 49.3 | 49.1 (1.00) | 48.6 (0.99) | 50.1 (1.02) | 35.0 | {110} | 1.44 |
| Ex. 3 | 48.3 | 48.5 (1.00) | 49.2 (1.01) | 48.3 (1.02) | 37.8 | {110} | 1.38 |
| Ex. 4 | 53.6 | 52.3 (0.98) | 55.2 (1.03) | 53.2 (0.99) | 38.2 | {110} | 1.45 |
| Ex. 5 | 55.6 | 56.3 (1.01) | 55.4 (1.00) | 55.1 (0.99) | 37.5 | {110} | 1.41 |
| Ex. 6 | 47.9 | 48.6 (1.02) | 47.2 (0.99) | 47.8 (1.00) | 35.2 | {110} | 1.12 |
| Ex. 7 | 46.5 | 45.6 (0.98) | 47.3 (1.02) | 46.5 (1.00) | 33.8 | {110} | 1.09 |
| Comp. Ex. 1 | 77.3 | 77.2 (1.00) | 78.5 (1.02) | 76.1 (0.98) | — | {110} | 4.25 |
| Comp. Ex. 2 | 34.9 | 35.1 (1.01) | 33.5 (0.96) | 36.1 (1.03) | 630.1 | {100} | 0.28 |

*The values in parentheses each represent a ratio to $HV_{tav}$.
The symbol "—" in the field of the average crystal grain size indicates inability to take a measurement due to difficulty in identification of the crystal gain boundary.

Examples 2 to 7, Comparative Examples 1 and 2

An Au billet produced in the same manner as in Example 1 was subjected to forging in the same manner as in Example 1 at a processing rate shown in Table 1 to produce an Au target material. Then, the Au target material after forging was subjected to heat treatment under the conditions shown in Table 1. After that, the Au target material after heat treatment was ground to produce an Au sputtering target having the same shape as that of Example 1. The Vickers The Au sputtering targets of Examples 1 to 7 and Comparative Examples 1 and 2 were set in a single wafer sputtering apparatus (apparatus name: ANELVA SPF530H). After vacuum evacuation of the apparatus to $1 \times 10^{-3}$ Pa or less, sputtering was performed under the following conditions: Ar gas pressure, 0.4 Pa; applied power, DC 100 W; target-substrate distance, 40 mm; and sputtering time, 5 min, whereby Au films were formed on 6-inch Si substrates (wafers), respectively. The film thickness distribution of each of the obtained Au films was evaluated as follows. The substrate on which the Au film had been formed was set in an X-ray fluorescence thickness meter, and the film thickness of the Au film was measured under the following conditions: measurement time, 60 sec; the number of repetitive measurements, 10; measurement start point, substrate end portion; and measurement point interval, 5 mm. Four measurement axes were set for the film thickness measurement: two horizontal and vertical axes passing the center of the substrate and two horizontal and vertical axes passing the center of the substrate rotated by 45° from the original position. After the measurement, 10-point average film thickness was determined at each measurement point. Then, the standard deviation of the measurement values obtained at the same measurement positions on each of the four axes was determined, and an average value of the standard deviations of measurement values at all the measurement points was determined. The results are shown in Table 3 as a standard deviation σ of the film thickness. Then, the resistance value of the Au film was measured by a four probe method, and a standard deviation σ of the resistance value was determined as in the case of the film thickness. The results are shown in Table 3 as the standard deviation σ of the resistance value.

TABLE 3

| | Film formation evaluation result | |
|---|---|---|
| | Standard deviation σ of film thickness | Standard deviation σ of resistance value |
| Ex. 1 | 8.2 | 5.2 |
| Ex. 2 | 7.9 | 4.6 |
| Ex. 3 | 8.9 | 5.9 |
| Ex. 4 | 9.1 | 6.1 |
| Ex. 5 | 8.6 | 6.9 |
| Ex. 6 | 8.6 | 6.5 |
| Ex. 7 | 8.9 | 6.1 |
| Comp. Ex. 1 | 14.0 | 10.6 |
| Comp. Ex. 2 | 20.0 | 15.2 |

Table 2 and Table 3 reveal that, in the Au sputtering targets of Examples 1 to 7, the Vickers hardness is 40 or more and 60 or less, and the location-dependent variation in the Vickers hardness is small. Further, the average crystal grain size is 15 μm or more and 200 μm or less, the {110} plane is preferentially oriented to the sputtering surface, and the orientation index N of the {110} plane is larger than 1. An Au film formed by sputtering using the Au sputtering target having the above Vickers hardness, average crystal grain size, and preferentially oriented plane of the sputtering surface is excellent in uniformity of the film thickness distribution and in uniformity of the resistance value.

Examples 8 to 12

An Au billet produced in the same manner as in Example 1 was subjected to forging in the same manner as in Example 1 at a processing rate shown in Table 4 to produce an Au target material. Then, the Au target material after forging was subjected to heat treatment under the conditions shown in Table 4. After that, the Au target material after heat treatment was ground to produce an Au sputtering target having the same shape as that of Example 1.

TABLE 4

| | | Processing rate | Heat treatment condition | |
|---|---|---|---|---|
| | Au purity [%] | during forging [%] | Temperature [° C.] | Time [min] |
| Ex. 8 | 99.99 | 80 | 500 | 20 |
| Ex. 9 | 99.99 | 80 | 500 | 30 |
| Ex. 10 | 99.99 | 80 | 500 | 120 |
| Ex. 11 | 99.99 | 80 | 400 | 20 |
| Ex. 12 | 99.99 | 80 | 300 | 20 |

The Vickers hardness of the obtained Au sputtering target was measured in the same manner as in Example 1. Further, the average crystal grain size of the obtained Au sputtering target was measured according to the above-described plate-shaped sputtering target measurement method. As the measurement results, the average crystal grains sizes ($AD_{av1}$, $AD_{av2}$, $AD_{av3}$) in the sputtering surface, first cross section, and second cross section, the average value (average crystal grain size ($AD_{tav}$) of the entire target) of the above average crystal grain sizes, and ratios of the respective $AD_{av1}$, $AD_{av2}$, $AD_{av3}$ to the $AD_{tav}$ are shown in Table 5. Further, the sputtering surface of the Au sputtering target was subjected to X-ray diffraction, and the preferentially oriented crystal plane was evaluated according to the above-described method. Further, the orientation index N of the {110} plane was determined according to the above-described method. The results are shown in Table 5. Such an Au sputtering target was subjected to a film formation process in the same manner as in Example 1, and the standard deviation σ of the film thickness of an Au film to be obtained and the standard deviation σ of the resistance value of the Au film were determined. The results are shown in Table 6.

TABLE 5

| | Vickers hardness | Average crystal grain size* [μm] | | | | Preferential crystal | {110} plane orientation |
|---|---|---|---|---|---|---|---|
| | $HV_{tav}$ | $AD_{tav}$ | $AD_{av1}$ | $AD_{av2}$ | $AD_{av3}$ | plane | index N |
| Ex. 8 | 49.8 | 35.0 | 35.2 (1.00) | 36.1 (1.03) | 33.8 (0.96) | {110} | 1.43 |
| Ex. 9 | 47.5 | 36.8 | 36.2 (0.99) | 37.1 (1.01) | 36.8 (1.00) | {110} | 1.60 |
| Ex. 10 | 51.2 | 38.4 | 39.1 (1.02) | 38.5 (1.00) | 37.6 (0.98) | {110} | 1.51 |
| Ex. 11 | 50.2 | 34.9 | 35.2 (1.01) | 36.3 (1.04) | 33.3 (0.95) | {110} | 1.33 |
| Ex. 12 | 53.2 | 34.9 | 34.6 (0.99) | 35.9 (1.03) | 34.1 (0.98) | {110} | 1.42 |
| Comp. Ex. 1 | 77.3 | — | — | — | — | {110} | 4.25 |

TABLE 5-continued

|  | Vickers hardness | Average crystal grain size* [μm] | | | | Preferential crystal | {110} plane orientation |
| --- | --- | --- | --- | --- | --- | --- | --- |
|  | $HV_{tav}$ | $AD_{tav}$ | $AD_{av1}$ | $AD_{av2}$ | $AD_{av3}$ | plane | index N |
| Comp. Ex. 2 | 34.9 | 630.1 | 620.0 (0.98) | 637.9 (1.01) | 641.3 (1.00) | {100} | 0.28 |

*The values in parentheses each represent a ratio to $AD_{tav}$.
The symbol "—" in the field of the average crystal grain size indicates inability to take measurements due to difficulty in identification of the crystal gain boundary.

TABLE 6

| | Film formation evaluation result | |
| --- | --- | --- |
| | Standard deviation σ of film thickness | Standard deviation σ of resistance value |
| Ex. 8 | 8.6 | 5.6 |
| Ex. 9 | 8.1 | 4.2 |
| Ex. 10 | 8.5 | 4.6 |
| Ex. 11 | 9.3 | 5.9 |
| Ex. 12 | 8.2 | 6.1 |
| Comp. Ex. 1 | 14.0 | 10.6 |
| Comp. Ex. 2 | 20.0 | 15.2 |

Examples 13 to 21, Comparative Examples 3 and 4

First, an Au mass was put into a graphite crucible and melted. An obtained Au molten was cast into a graphite mold to produce an Au ingot. The surface of the Au ingot was ground, whereby an Au billet (purity: 99.99%) having a width of 200 mm, a length of 300 mm, and a thickness of 45 mm was produced. Subsequently, the Au billet was hot-rolled at a temperature of 800° C., whereby an Au target material having a width of 70 mm, a length of 200 mm, and a thickness of 45 mm was obtained. The processing rate in the rolling was set to 80% as a thickness reduction. The Au target material after rolling was subjected to heat treatment under the conditions shown in Table 7. The Au target material after the heat treatment was ground to produce a circular plate-shaped Au sputtering target having a diameter of 152.4 mm and a thickness of 5 mm.

TABLE 7

| | Au purity [%] | Processing rate during rolling [%] | Heat treatment condition | |
| --- | --- | --- | --- | --- |
| | | | Temperature [° C.] | Time [min] |
| Ex. 13 | 99.99 | 80 | 500 | 20 |
| Ex. 14 | 99.99 | 80 | 500 | 30 |
| Ex. 15 | 99.99 | 80 | 500 | 60 |
| Ex. 16 | 99.99 | 80 | 500 | 90 |
| Ex. 17 | 99.99 | 80 | 500 | 120 |
| Ex. 18 | 99.99 | 80 | 400 | 20 |
| Ex. 19 | 99.99 | 80 | 400 | 30 |
| Ex. 20 | 99.99 | 80 | 300 | 20 |
| Ex. 21 | 99.99 | 80 | 300 | 30 |
| Comp. Ex. 3 | 99.99 | 80 | 100 | 30 |
| Comp. Ex. 4 | 99.99 | 80 | 600 | 30 |

The obtained Au sputtering target was measured to determine the average value ($HV_{tav}$) of the Vickers hardness of the entire target and the average crystal grain size ($AD_{tav}$) of the entire target in the same manner as in Example 1. Further, the crystal plane preferentially oriented to the sputtering surface of the Au sputtering target was evaluated in the same manner as in Example 1, and orientation index N of the {110} plane was determined in the same manner as in Example 1. The results are shown in Table 8. Such an Au sputtering target was subjected to a film formation process in the same manner as in Example 1, and the standard deviation σ of the film thickness of an Au film to be obtained and the standard deviation σ of the resistance value of the Au film were determined. The results are shown in Table 9.

TABLE 8

| | Vickers hardness $HV_{tav}$ | Average crystal grain size [μm] $AD_{tav}$ | Preferential crystal plane | {110} plane orientation index N |
| --- | --- | --- | --- | --- |
| Ex. 13 | 42.0 | 102.0 | {110} | 1.44 |
| Ex. 14 | 41.8 | 101.4 | {110} | 1.46 |
| Ex. 15 | 43.1 | 109.9 | {110} | 1.52 |
| Ex. 16 | 42.5 | 105.4 | {110} | 1.36 |
| Ex. 17 | 43.8 | 103.2 | {110} | 1.41 |
| Ex. 18 | 45.0 | 103.9 | {110} | 1.54 |
| Ex. 19 | 44.2 | 105.3 | {110} | 1.35 |
| Ex. 20 | 41.0 | 103.1 | {110} | 1.48 |
| Ex. 21 | 42.5 | 104.0 | {110} | 1.31 |
| Comp. Ex. 3 | 62.8 | — | — | — |
| Comp. Ex. 4 | 35.5 | 640.0 | — | — |

TABLE 9

| | Film formation evaluation result | |
| --- | --- | --- |
| | Standard deviation σ of film thickness | Standard deviation σ of resistance value |
| Ex. 13 | 6.5 | 4.2 |
| Ex. 14 | 6.1 | 5.2 |
| Ex. 15 | 5.8 | 6.2 |
| Ex. 16 | 5.5 | 6.1 |
| Ex. 17 | 5.1 | 5.2 |
| Ex. 18 | 5.9 | 4.8 |
| Ex. 19 | 6.8 | 5.8 |
| Ex. 20 | 7.1 | 6.2 |
| Ex. 21 | 6.2 | 5.1 |
| Comp. Ex. 3 | 20.5 | 13.2 |
| Comp. Ex. 4 | 28.6 | 16.5 |

Example 22

First, an Au mass was put into a graphite crucible and melted. An obtained Au molten was cast into a graphite mold to produce an Au ingot. The surface of the Au ingot was ground and hollowed out with a diameter of 50 mm, whereby a cylindrical Au billet (purity: 99.99%) having an outer diameter of 100 mm, an inner diameter of 50 mm, and a length of 200 mm was produced. Subsequently, the cylindrical Au billet was hot-forged at a temperature of 800° C.

with a core material inserted into the hollow portion thereof, whereby a pipe shaped Au target material having an outer diameter of 80 mm, an inner diameter of 50 mm, and a length of 400 mm or more was obtained. The processing rate in the forging was set to 35% as a thickness reduction. The pipe shaped Au target material after forging was subjected to heat treatment at a temperature of 500° C. for 30 minutes. The Au target material after heat treatment was ground to produce a cylindrical Au sputtering target having an outer diameter of 70 mm, an inner diameter of 65 mm, and a length of 350 mm.

The Vickers hardness of the obtained Au sputtering target was measured according to the above-described cylindrical sputtering target measurement method. The Vickers hardness was measured at the measurement points with a 200 gf test force (pressing load). The results were as follows: the average value ($HV_{av1}$) of the Vickers hardness on the first straight line in the sputtering surface was 50.6, the average value ($HV_{av2}$) of the Vickers hardness on the second straight line in the sputtering surface was 50.4, the average value ($HV_{av3}$) of the Vickers hardness in the cross section was 52.0, and the average value (Vickers hardness $HV_{tav}$ of the entire target) of the $HV_{av1}$, $HV_{av2}$, and $HV_{av3}$ was 51.0. The ratios of the $HV_{av1}$, $HV_{av2}$, and $HV_{av3}$ to the Vickers hardness ($HV_{tav}$) of the entire target were 0.99 ($HV_{av1}/HV_{tav}$), 0.99 ($HV_{av2}/HV_{tav}$), and 1.02 ($HV_{av3}/HV_{tav}$), respectively.

Then, the average crystal grain size of the Au sputtering target was measured according to the above-described cylindrical sputtering target measurement method. As a result, the average crystal grain size ($AD_{tav}$) of the entire target was 38.1 μm. Further, the sputtering surface of the Au sputtering target was subjected to X-ray diffraction, and the preferentially oriented crystal plane was evaluated according to the above-described method. As a result, preferential orientation of the {110} plane of Au to the sputtering surface was recognized. Then, the orientation index N of the {110} plane according to the above-described method was determined, and the result was 1.31. Such a cylindrical Au sputtering target was subjected to a film formation process to be described later, and the characteristics of an Au film to be obtained were evaluated.

Examples 23 to 28, Comparative Examples 5 and 6

An Au billet produced in the same manner as in Example 22 was subjected to forging in the same manner as in Example 22 at a processing rate shown in Table 10 to produce an Au target material. Then, the Au target material after the forging was subjected to heat treatment under the conditions shown in Table 10. After that, the Au target material after heat treatment was ground to produce an Au sputtering target having the same shape as that of Example 22. The Vickers hardness and average crystal grain size ($AD_{tav}$) of the Au sputtering target were measured in the same manner as in Example 22. Further, the crystal plane preferentially oriented to the sputtering surface of the Au sputtering target was evaluated in the same manner as in Example 22, and orientation index N of the {110} plane was determined in the same manner as in Example 22. The results are shown in Table 11. Such a cylindrical Au sputtering target was subjected to a film formation process to be described later, and the characteristics of an Au film to be obtained were evaluated.

TABLE 10

| | Au purity [%] | Processing rate during forging [%] | Heat treatment condition | |
|---|---|---|---|---|
| | | | Temperature [° C.] | Time [min] |
| Ex. 22 | 99.99 | 35 | 500 | 30 |
| Ex. 23 | 99.99 | 35 | 500 | 60 |
| Ex. 24 | 99.99 | 35 | 500 | 90 |
| Ex. 25 | 99.99 | 35 | 400 | 30 |
| Ex. 26 | 99.99 | 35 | 300 | 30 |
| Ex. 27 | 99.99 | 35 | 400 | 60 |
| Ex. 28 | 99.99 | 35 | 300 | 60 |
| Comp. Ex. 5 | 99.99 | 35 | 100 | 30 |
| Comp. Ex. 6 | 99.99 | 35 | 600 | 30 |

TABLE 11

| | Vickers hardness* | | | | Average crystal grain size [μm] | Preferential crystal plane | {110} plane orientation index N |
|---|---|---|---|---|---|---|---|
| | $HV_{tav}$ | $HV_{av1}$ | $HV_{av2}$ | $HV_{av3}$ | $AD_{tav}$ | | |
| Ex. 22 | 51.0 | 50.6 (0.99) | 50.4 (0.99) | 52.0 (1.02) | 38.1 | {110} | 1.31 |
| Ex. 23 | 51.5 | 50.6 (0.98) | 51.3 (1.00) | 52.6 (1.02) | 41.2 | {110} | 1.52 |
| Ex. 24 | 50.4 | 49.2 (0.98) | 51.2 (1.02) | 50.7 (1.01) | 35.1 | {110} | 1.52 |
| Ex. 25 | 53.7 | 53.1 (0.99) | 54.1 (1.01) | 54.0 (1.00) | 38.6 | {110} | 1.43 |
| Ex. 26 | 55.8 | 56.0 (1.00) | 55.5 (0.99) | 55.9 (1.00) | 42.8 | {110} | 1.35 |
| Ex. 27 | 49.2 | 49.8 (1.01) | 48.6 (0.99) | 49.2 (1.00) | 39.8 | {110} | 1.18 |
| Ex. 28 | 49.6 | 51.2 (1.03) | 49.2 (0.99) | 48.3 (0.97) | 40.8 | {110} | 1.09 |
| Comp. Ex. 5 | 78.1 | 78.1 (1.00) | 77.1 (1.00) | 75.0 (0.98) | — | {110} | 4.98 |
| Comp. Ex. 6 | 35.1 | 36.2 (1.03) | 33.8 (0.96) | 35.2 (1.00) | 509.5 | {100} | 0.38 |

*The values in parentheses each represent a ratio to $HV_{tav}$.
The symbol "—" in the field of the average crystal grain size indicates inability to take a measurement due to difficulty in identification of the crystal gain boundary.

The Au sputtering targets of Examples 22 to 28 and Comparative Examples 5 and 6 were set in a cylindrical sputtering apparatus. After vacuum evacuation of the apparatus to $1\times10^{-3}$ Pa or less, sputtering was performed under the following conditions: Ar gas pressure, 0.4 Pa; applied power, DC 100 W; target-substrate distance, 40 mm; and sputtering time, 5 min, whereby Au films were formed on 6-inch Si substrates (wafers), respectively. The film thickness distribution of each of the obtained Au films was measured according to the above-described method to determine the standard deviation σ of the film thickness of an Au film to be obtained. Further, the standard deviation σ of the resistance value of the Au film was determined according to the above-described method. The results are shown in Table 12.

TABLE 12

| | Film formation evaluation result | |
|---|---|---|
| | Standard deviation σ of film thickness | Standard deviation σ of resistance value |
| Ex. 22 | 8.1 | 4.6 |
| Ex. 23 | 8.6 | 5.1 |
| Ex. 24 | 7.5 | 5.9 |
| Ex. 25 | 8.5 | 4.8 |
| Ex. 26 | 9.1 | 4.8 |
| Ex. 27 | 8.6 | 5.2 |
| Ex. 28 | 8.9 | 5.6 |
| Comp. Ex. 5 | 20.1 | 16.4 |
| Comp. Ex. 6 | 25.6 | 15.1 |

Table 11 and Table 12 reveal that, in the Au sputtering targets of Examples 22 to 28, the Vickers hardness is 40 or more and 60 or less, and the location-dependent variation in the Vickers hardness is small. Further, the average crystal grain size is 15 μm or more and 200 μm or less, the {110} plane is preferentially oriented to the sputtering surface, and the orientation index N of the {110} plane is larger than 1. An Au film formed by sputtering using the Au sputtering target having the above Vickers hardness, average crystal grain size, and preferentially oriented plane of the sputtering surface is excellent in uniformity of the film thickness distribution and in uniformity of the resistance value.

Examples 29 to 33

An Au billet produced in the same manner as in Example 22 was subjected to forging in the same manner as in Example 22 at a processing rate shown in Table 13 to produce a cylindrical Au target material. Then, the Au target material after the forging was subjected to heat treatment under the conditions shown in Table 13. After that, the Au target material after heat treatment was ground to produce an Au sputtering target having the same shape as that of Example 22.

TABLE 13

| | | Processing rate during forging [%] | Heat treatment condition | |
|---|---|---|---|---|
| | Au purity [%] | | Temperature [° C.] | Time [min] |
| Ex. 29 | 99.99 | 35 | 500 | 20 |
| Ex. 30 | 99.99 | 35 | 500 | 30 |
| Ex. 31 | 99.99 | 35 | 500 | 120 |
| Ex. 32 | 99.99 | 35 | 400 | 20 |
| Ex. 33 | 99.99 | 35 | 300 | 20 |

The Vickers hardness of the obtained Au sputtering target was measured in the same manner as in Example 22. Further, the average crystal grain size of the obtained Au sputtering target was measured according to the above-described cylindrical sputtering target measurement method. As the measurement results, the average crystal grains sizes ($AD_{av1}$, $AD_{av2}$, $AD_{av3}$) in the first sputtering surface, second sputtering surface, and cross section, the average value (average crystal grain size ($AD_{tav}$) of the entire target) of the above average crystal grain sizes, and ratios of the respective $AD_{av1}$, $AD_{av2}$, $AD_{av3}$ to the $AD_{tav}$ are shown in Table 14. Further, the sputtering surface of the Au sputtering target was subjected to X-ray diffraction, and the preferentially oriented crystal plane was evaluated according to the above-described method. Further, the orientation index N of the {110} plane was determined. The results are shown in Table 14. Such an Au sputtering target was subjected to a film formation process in the same manner as in Example 22, and the standard deviation σ of the film thickness of an Au film to be obtained and the standard deviation σ of the resistance value of the Au film were determined. The results are shown in Table 15.

TABLE 14

| | Vickers hardness | Average crystal grain size* [μm] | | | | Preferential crystal | {110} plane orientation |
|---|---|---|---|---|---|---|---|
| | $HV_{tav}$ | $AD_{tav}$ | $AD_{av1}$ | $AD_{av2}$ | $AD_{av3}$ | plane | index N |
| Ex. 29 | 52.8 | 103.1 | 101.2 (0.98) | 102.6 (0.99) | 105.6 (1.02) | {110} | 1.55 |
| Ex. 30 | 51.2 | 108.1 | 105.3 (0.99) | 104.6 (0.99) | 108.1 (1.02) | {110} | 1.35 |
| Ex. 31 | 49.3 | 109.8 | 109.2 (0.99) | 110.2 (1.00) | 110.1 (1.00) | {110} | 1.42 |
| Ex. 32 | 54.6 | 106.1 | 102.2 (0.98) | 104.1 (1.00) | 106.1 (1.02) | {110} | 1.51 |
| Ex. 33 | 55.5 | 103.2 | 103.2 (1.00) | 105.2 (1.02) | 101.1 (0.98) | {110} | 1.48 |
| Comp. Ex. 5 | 78.1 | — | — | — | — | {110} | 4.98 |

TABLE 14-continued

|  | Vickers hardness | Average crystal grain size* [μm] | | | | Preferential crystal | {110} plane orientation |
|---|---|---|---|---|---|---|---|
|  | $HV_{tav}$ | $AD_{tav}$ | $AD_{av1}$ | $AD_{av2}$ | $AD_{av3}$ | plane | index N |
| Comp. Ex. 6 | 35.1 | 509.5 | 510.2 (1.00) | 506.2 (0.99) | 512.0 (1.00) | {100} | 0.38 |

*The values in parentheses each represent a ratio to $AD_{tav}$.
The symbol "—" in the field of the average crystal grain size indicates inability to take measurements due to difficulty in identification of the crystal gain boundary.

TABLE 15

|  | Film formation evaluation result | |
|---|---|---|
|  | Standard deviation σ of film thickness | Standard deviation σ of resistance value |
| Ex. 29 | 8.6 | 4.1 |
| Ex. 30 | 8.1 | 4.6 |
| Ex. 31 | 8.5 | 4.0 |
| Ex. 32 | 9.3 | 5.9 |
| Ex. 33 | 8.2 | 5.7 |
| Comp. Ex. 5 | 20.1 | 16.4 |
| Comp. Ex. 6 | 25.6 | 15.1 |

What is claimed is:

1. A gold film production method comprising:
preparing a gold sputtering target which is made of gold and inevitable impurities and in which an average value of Vickers hardness is 40 or more and 60 or less, an average value of crystal grain size is 30 μm or more and 200 μm or less, and a {110} plane of gold is preferentially oriented to a surface to be sputtered of the gold sputtering target; and
forming a gold film on a film-forming base material through sputtering of the gold sputtering target, and
wherein the surface to be sputtered is subjected to X-ray diffraction, and an orientation index N of each crystal plane is found according to the following equation (1) based on a diffraction intensity ratio of each of the crystal plane of gold, the orientation index N of the {110} plane of gold is larger than 1, and the largest among the orientation indices N of all the crystal planes:

$$N = \left( \frac{\frac{I/I_{(hkl)}}{\sum(I/I_{(hkl)})}}{\frac{JCPDS \cdot I/I_{(hkl)}}{\sum(JCPDS \cdot I/I_{(hkl)})}} \right)$$ [Equation (1)]

where $I/I_{(hkl)}$ is the diffraction intensity ratio of an (hkl) plane in the X-ray diffraction, $JCPDS \cdot I/I_{(hkl)}$ is the diffraction intensity ratio of the (hkl) plane provided on the JCPDS card for gold, $\Sigma(I/I_{(hkl)})$ is the sum of the diffraction intensity ratios of all the crystal planes in the X-ray diffraction, and $\Sigma(JCPDS \cdot I/I_{(hkl)})$ is the sum of the diffraction intensity ratios of all the crystal planes provided on the JCPDS card for gold.

2. The gold film production method according to claim 1, wherein
the average value of the Vickers hardness in the gold sputtering target is 45 or more and 55 or less,
the average crystal grain size in the gold sputtering target is 30 μm or more and 150 μm or less, and
the orientation index N of the {110} plane of gold is 1.3 or more.

3. The gold film production method according to claim 1, wherein
when the gold sputtering target is plate-shaped, the average value of the Vickers hardness of the sputtering target ($HV_{tav}$) is an average value of: an average value of the Vickers hardness of the surface to be sputtered ($HV_{av1}$); an average value of the Vickers hardness on a first cross-section orthogonal to the surface to be sputtered ($HV_{av2}$); and an average value of the Vickers hardness on a second cross-section perpendicular to the first cross-section ($HV_{av3}$), and
when the gold sputtering target is cylindrical, the average value of the Vickers hardness of the gold sputtering target ($HV_{tav}$) is an average value of: an average value of the Vickers hardness on an arbitrary first straight line parallel to a cylinder axis of the surface to be sputtered ($HV_{av1}$); an average value of the Vickers hardness on a second straight line rotated by 90° from the first straight line ($HV_{av2}$); and an average value of the Vickers hardness of the cross section orthogonal to the cylinder axis ($HV_{av3}$).

4. The gold film production method according to claim 1, wherein
when the gold sputtering target is plate-shaped, the average value of the average crystal grain size of the gold sputtering target ($AD_{tav}$) is an average value of: an average value of the average crystal grain size on the surface to be sputtered ($AD_{av1}$); an average value of the average crystal grain size on a first cross-section orthogonal to the surface to be sputtered ($AD_{av2}$); and an average value of the surface to be sputtered; and the average value of the average crystal grain size on a second cross-section at right angle to the surface to be sputtered and the first cross-section ($AD_{av3}$), and
when the gold sputtering target is cylindrical, the average value of the average crystal grain size of the gold sputtering target ($AD_{tav}$) is an average value of: the average value of the average crystal grain size on an arbitrary first straight line parallel to a cylinder axis on the surface to be sputtered($AD_{av1}$); the average value of the average crystal grain size on a second straight line rotated by 90° from the first straight line($AD_{av2}$); and the average value of the average crystal grain size on a cross-section orthogonal to the cylinder axis ($AD_{av3}$).

5. The gold film production method according to claim 3, wherein
the gold sputtering target is plate-shaped, and
the ratio $HV_{av1}/HV_{tav}$, the ratio $HV_{av2}/HV_{tav}$, and the ratio $HV_{av3}/HV_{tav}$ all fall within the range of 0.8 to 1.2.

6. The gold film production method according to claim 3, wherein the gold sputtering target is cylindrical, and the ratio $HV_{av1}/HV_{tav}$, the ratio $HV_{av2}/HV_{tav}$, and the ratio $HV_{av3}/HV_{tav}$ all fall within the range of 0.8 to 1.2.

7. The gold film production method according to claim 4, wherein the gold sputtering target is plate-shaped, and the ratio $AD_{av1}/AD_{tav}$, the ratio $AD_{av2}/AD_{tav}$, and the ratio $AD_{av3}/AD_{tav}$ all fall within the range of 0.8 to 1.2.

8. The gold film production method according to claim 4, wherein the gold sputtering target is cylindrical, and the ratio $AD_{av1}/AD_{tav}$, the ratio $AD_{av2}/AD_{tav}$, and the ratio $AD_{av3}/AD_{tav}$ all fall within the range of 0.8 to 1.2.

* * * * *